United States Patent
Yamana et al.

(10) Patent No.: US 12,208,595 B2
(45) Date of Patent: Jan. 28, 2025

(54) AlN JOINED BODY

(71) Applicant: NGK Insulators, Ltd., Nagoya (JP)

(72) Inventors: Keita Yamana, Nagoya (JP); Kazuhiro Nobori, Handa (JP); Genichi Yokota, Nagoya (JP); Tetsuhisa Abe, Tokoname (JP)

(73) Assignee: NGK INSULATORS, LTD., Nagoya (JP)

( * ) Notice: Subject to any disclaimer, the term of this patent is extended or adjusted under 35 U.S.C. 154(b) by 96 days.

(21) Appl. No.: 17/815,266

(22) Filed: Jul. 27, 2022

(65) Prior Publication Data

US 2023/0057187 A1 Feb. 23, 2023

(30) Foreign Application Priority Data

Aug. 23, 2021 (JP) ................. 2021-135883

(51) Int. Cl.
| | | |
|---|---|---|
| B32B 18/00 | (2006.01) | |
| B32B 3/30 | (2006.01) | |
| C04B 37/00 | (2006.01) | |
| H01L 21/67 | (2006.01) | |
| H05B 3/26 | (2006.01) | |

(52) U.S. Cl.
CPC .............. B32B 18/00 (2013.01); B32B 3/30 (2013.01); C04B 37/001 (2013.01); H01L 21/67103 (2013.01); H05B 3/265 (2013.01); C04B 2237/366 (2013.01)

(58) Field of Classification Search
None
See application file for complete search history.

(56) References Cited

U.S. PATENT DOCUMENTS

| | | | |
|---|---|---|---|
| 5,985,464 A | * | 11/1999 | Schmitt ............... H01L 23/3735 428/209 |
| 6,261,708 B1 | | 7/2001 | Ohashi et al. |
| 2002/0007911 A1 | | 1/2002 | Kuibira et al. |
| 2006/0110624 A1 | | 5/2006 | Hattori et al. |
| 2012/0231243 A1 | * | 9/2012 | Watanabe ............. C04B 35/581 428/697 |
| 2015/0184030 A1 | | 7/2015 | Goto et al. |
| 2017/0127475 A1 | | 5/2017 | Nagai et al. |
| 2020/0090964 A1 | | 3/2020 | Unno et al. |
| 2020/0163165 A1 | | 5/2020 | Unno |

FOREIGN PATENT DOCUMENTS

| | | |
|---|---|---|
| CN | 104744046 A | 7/2015 |
| CN | 106653652 A | 5/2017 |
| EP | 0856499 A2 * | 5/1998 |

(Continued)

OTHER PUBLICATIONS

Taiwanese Office Action dated Jul. 17, 2023 (Application No. 111131119).

(Continued)

*Primary Examiner* — Kim S. Horger
(74) *Attorney, Agent, or Firm* — BURR PATENT LAW, PLLC

(57) ABSTRACT

An AlN joined body includes a first AlN member and a second AlN member that are joined together. The content of yttria in the first AlN member is equal to or below the detection limit. The second AlN member contains yttria.

18 Claims, 4 Drawing Sheets

(56) References Cited

FOREIGN PATENT DOCUMENTS

| | | |
|---|---|---|
| JP | 6878677 B2 | 6/2021 |
| KR | 10-1998-0070861 A | 10/1998 |
| KR | 10-1851806 B1 | 4/2018 |
| KR | 10-2019-0142384 A | 12/2019 |
| TW | 200624528 A | 7/2006 |
| TW | 201536466 A | 10/2015 |
| TW | 201941352 A | 10/2019 |

OTHER PUBLICATIONS

Chinese Office Action (Application No. 202210678549.0) dated Apr. 29, 2023 (11 pages).
Chinese Office Action (Application No. 202210678549.0) dated Sep. 19, 2023 (with English translation) (18 pages).
Arika Miyazaki, *Analysis of Environmental Sample by Plasma Spectroscopy Method First Edition*, First Edition, AGNE Gijutsu Center, Inc., Feb. 20, 2020, 10 pages, Colophon (2 pages).
Japanese Office Action (with English translation) dated Jan. 16, 2024 (Application No. 2021-135883).
Korean Office Action (with English translation) dated Aug. 28, 2024 (Application No. 10-2022-0097075).

\* cited by examiner ns
AlN JOINED BODY

BACKGROUND OF THE INVENTION

1. Field of the Invention

The present invention relates to an AlN joined body.

2. Description of the Related Art

One previously known ceramic heater includes: an AlN-made plate having a wafer placement surface for placing a wafer thereon and including a resistance heating element embedded therein; and an AlN-made cylindrical shaft joined to a back side of the plate that is opposite to the wafer placement surface (see PTL 1).

CITATION LIST

Patent Literature

PTL 1: JP 6878677 B

SUMMARY OF THE INVENTION

The above-described ceramic heater is produced, for example, by joining together an AlN-made plate containing 5% by mass of yttria and an AlN-made cylindrical shaft containing 5% by mass of yttria with a flux applied therebetween. In some recent ceramic heaters, a groove for a thermocouple is provided in the plate in order to measure the temperature of the outer circumference of the plate using the thermocouple. Moreover, a groove for gas purging may be provided, which is used when a film is deposited on a wafer. Therefore, studies were conducted on joining of a cylindrical shaft to a plate having such a groove formed therein. It was found that, with the conventional joining method, a crack starting from the groove occurred. The occurrence of the crack is due to high pressing pressure for joining.

The present invention has been made to solve the foregoing problem, and it is an object to provide an AlN joined body well joined with no crack.

In one aspect, the AlN joined body of the present invention includes a first AlN member and a second AlN member that are joined together, wherein the content of yttria in the first AlN member is equal to or below a detection limit, and wherein the second AlN member contains yttria.

In another aspect, the AlN joined body of the present invention includes a first AlN member and a second AlN member that are joined together, wherein the first AlN member has a first diffusion layer formed as a result of the joining, wherein the second AlN member has a second diffusion layer formed as a result of the joining, wherein the content of yttria in a portion of the first AlN member other than the first diffusion layer is equal to or below a detection limit, and wherein a portion of the second AlN member other than the second diffusion layer contains yttria.

DETAILED DESCRIPTION OF THE INVENTION

Figure 1:
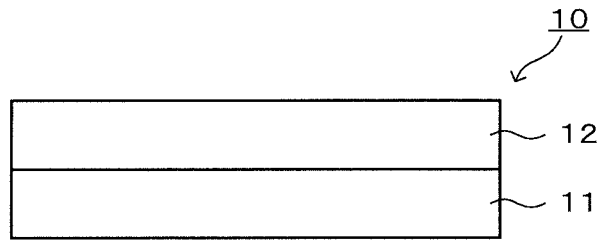
FIG. 1 is a front view of an AlN joined body 10.

Preferred embodiments of the present invention will next be described with reference to the drawings. FIGS. 1 to 4 are front views of AlN joined bodies 10 to 40, and FIG. 5 is a vertical cross-sectional view of a ceramic heater (the cross-sectional view is obtained by cutting the ceramic heater along a plane including its center axis). In the following description, "up-down," "right-left," and "front-rear" are as shown in FIG. 1. However, these "up-down," "right-left," and "front-rear" merely represent relative positional relations. In the present specification, "to" indicating a numerical range is used to mean that numerical values before and after it are included as lower and upper limits, respectively.

In the AlN joined body 10 shown in FIG. 1, a first AlN member 11 and a second AlN member 12 are joined together using a flux (a paste for joining). The flux used may be, for example, a material containing calcia (CaO), alumina ($Al_2O_3$), and yttria ($Y_2O_3$). The first AlN member 11 and the second AlN member 12 are disk members having the same size. The content of yttria in the first AlN member 11 is equal to or below the detection limit, and the second AlN member 12 contains yttria. The content of yttria in the second AlN member 12 is preferably 0.07% by mass or more. Preferably, the first AlN member 11 contains at least one oxide selected from the group consisting of rare earth metal oxides other than yttria, magnesia (MgO), and titania ($TiO_2$). The total amount of the oxide(s) added may be, for example, 0.1 to 3% by mass. Examples of the rare earth oxides include ceria ($CeO_2$) and samaria ($Sm_2O_3$). The first AlN member 11 preferably contains a rare earth metal oxide other than yttria or contains magnesia and titania and more preferably contains magnesia and titania.

Figure 2:
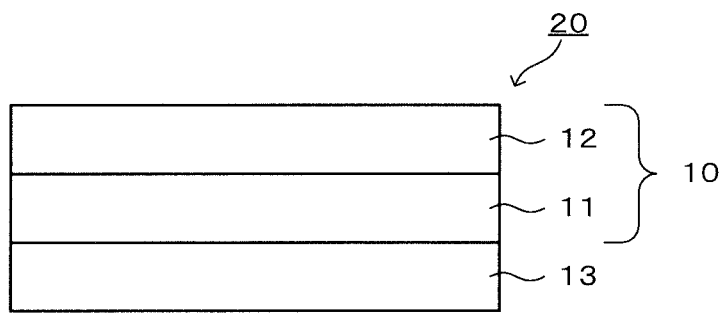
FIG. 2 is a front view of an AlN joined body 20.

In the AlN joined body 20 shown in FIG. 2, a third AlN member 13 is joined to a surface of the first AlN member 11 of the AlN joined body 10 using a flux, the surface being opposite to the joint surface of the first AlN member 11 that is joined to the second AlN member 12. The flux used may be, for example, a material containing calcia, alumina, and yttria. The third AlN member 13 is a disk member having the same size as that of the first and second AlN members 11 and 12. The third AlN member 13 contains yttria. The content of yttria in the third AlN member 13 is preferably 0.07% by mass or more.

Figure 3:
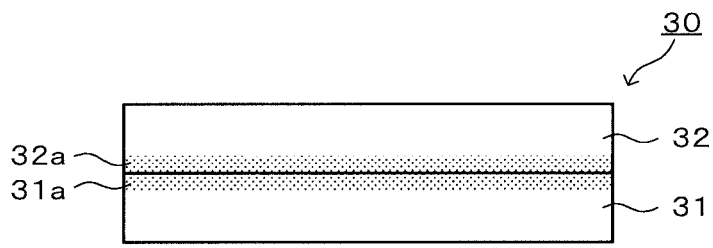
FIG. 3 is a front view of an AlN joined body 30.

In the AlN joined body 30 shown in FIG. 3, a first AlN member 31 and a second AlN member 32 are joined together using a flux. The flux used may be, for example, a material containing calcia (CaO), alumina ($Al_2O_3$), and yttria ($Y_2O_3$). The first AlN member 31 and the second AlN member 32 are disk members having the same size. The first AlN member 31 has a first diffusion layer 31a formed as a result of the joining. The second AlN member 32 has a second diffusion layer 32a formed as a result of the joining. The first and second diffusion layers 31a and 32a are layers into which the flux component has been diffused. The content of yttria in a portion of the first AlN member 31 other than the first diffusion layer 31a is equal to or below the detection limit, and a portion of the second AlN member 32 other than the second diffusion layer 32a contains yttria. The content of yttria in the portion of the second AlN member 32 other than the second diffusion layer 32a is preferably 0.07% by mass or more. Preferably, the first AlN member 31 contains at least one oxide selected from the group consisting of rare earth metal oxides other than yttria, magnesia (MgO), and titania ($TiO_2$). The total amount of the oxide(s) added may be, for example, 0.1 to 3% by mass. Examples of the rare earth oxides include ceria ($CeO_2$) and samaria ($Sm_2O_3$). The first AlN member 31 preferably contains a rare earth metal oxide other than yttria or contains magnesia and titania and more preferably contains magnesia and titania.

Figure 4:
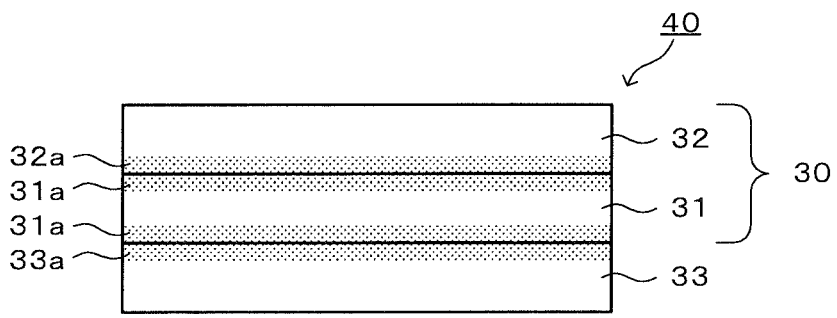
FIG. 4 is a front view of an AlN joined body 40.
Figure 5:
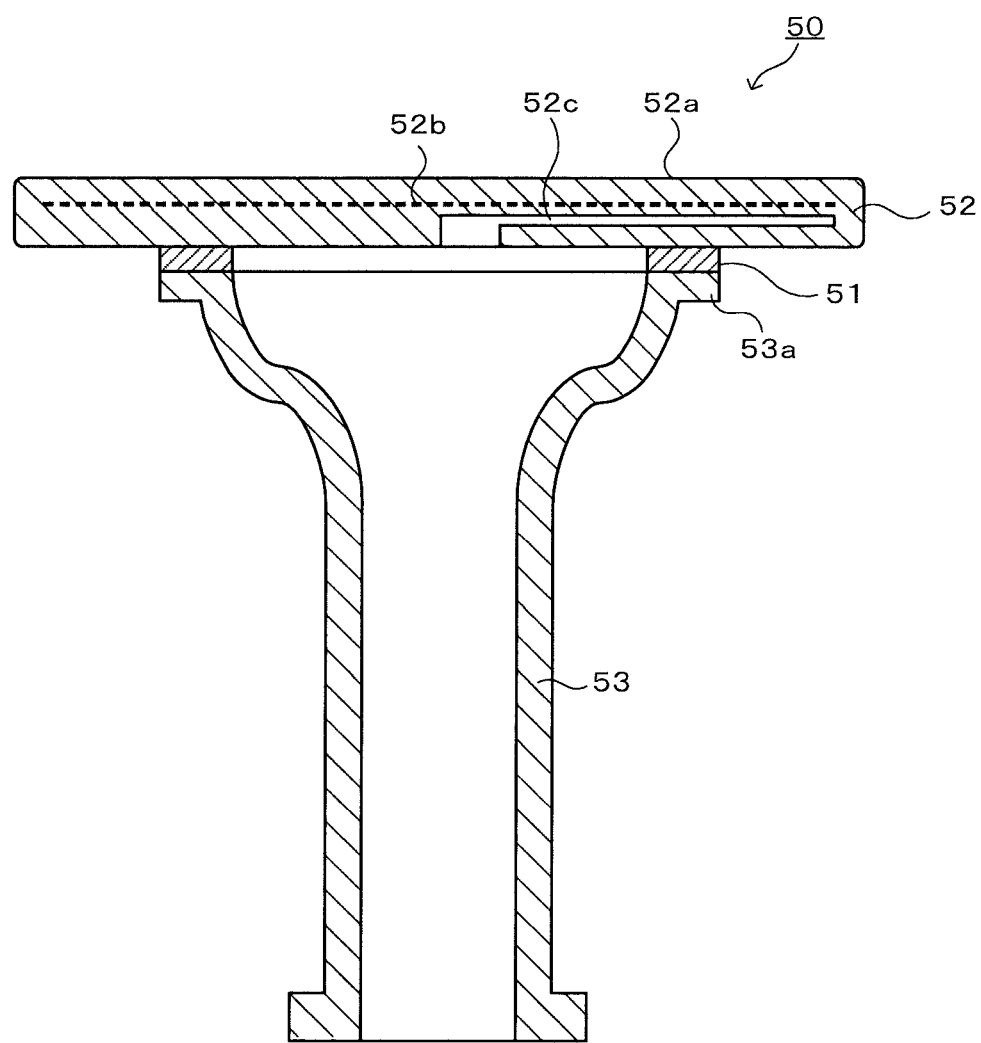
FIG. 5 is a vertical cross-sectional view of a ceramic heater 50.

In the AlN joined body 40 shown in FIG. 4, a third AlN member 33 is joined to a surface of the first AlN member 31 of the AlN joined body 30 using a flux, the surface being opposite to the joint surface of the first AlN member 31 that is joined to the second AlN member 32. The flux used may be, for example, a material containing calcia, alumina, and yttria. The third AlN member 33 is a disk member having the same size as that of the first and second AlN members 31 and 32. The first AlN member 31 has another first diffusion layer 31a formed as a result of the joining to the third AlN member 33. The third AlN member 33 has a third diffusion layer 33a formed as a result of the joining. The third diffusion layer 33a is a layer containing the flux component diffused therein. The content of yttria in a portion of the first AlN member 31 other than the two first diffusion layers 31a is equal to or below the detection limit. A portion of the third AlN member 33 other than the third diffusion layer 33a contains yttria. The content of yttria in the portion of the third AlN member 33 other than the third diffusion layer 33a is preferably 0.07% by mass or more.

Figure 6:
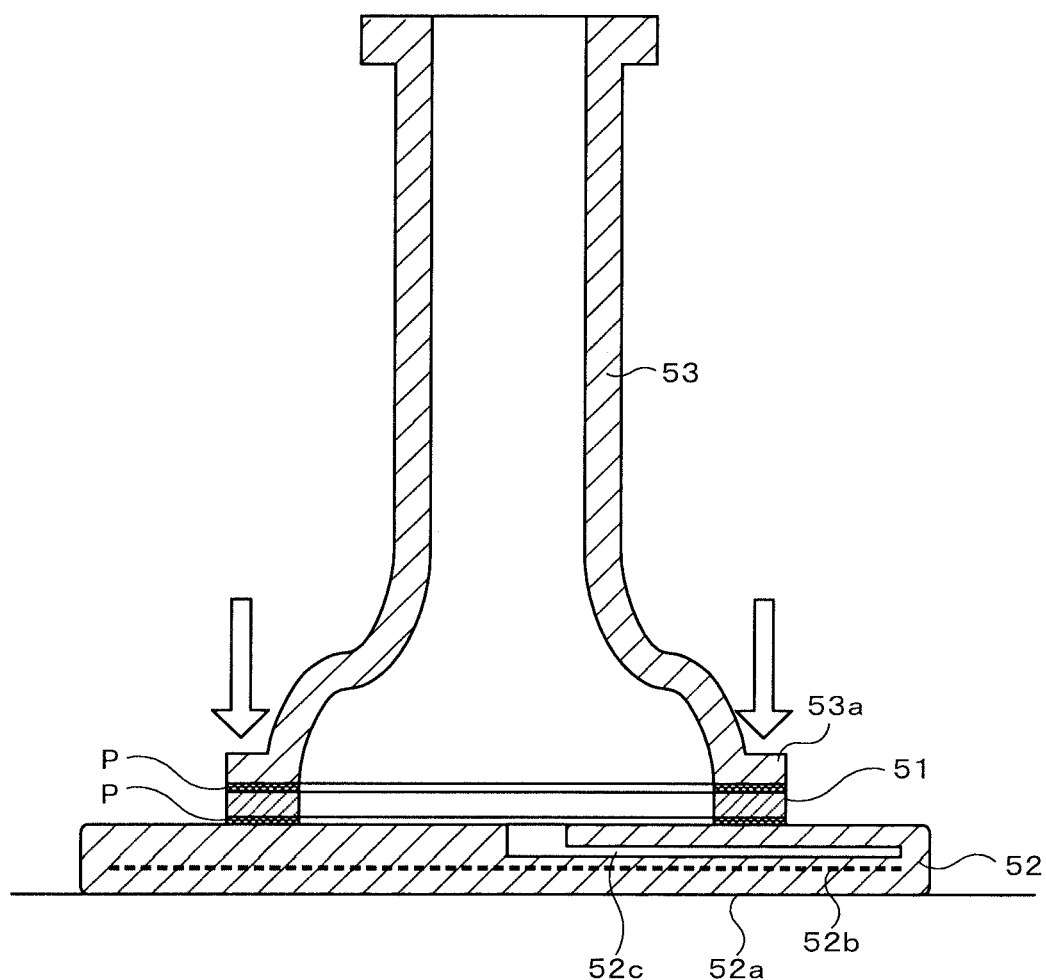
FIG. 6 is an illustration of a process for producing the ceramic heater 50.

The ceramic heater 50 shown in FIG. 5 includes: a circular plate 52 having a wafer placement surface 52a and including a resistance heating element 52b embedded therein; a cylindrical shaft 53 having a diameter smaller than that of the circular plate 52; and an intermediate ring 51 sandwiched between the circular plate 52 and the cylindrical shaft 53. The circular plate 52 has a thermocouple groove 52c that is provided thereinside so as to extend in the radial direction. The cylindrical shaft 53 has a flange 53a disposed on the side facing the circular plate 52. The intermediate ring 51 and the circular plate 52 are joined together using a flux, and the intermediate ring 51 and the cylindrical shaft 53 are joined together also using the flux. The flux used may be, for example, a material containing calcia, alumina, and yttria. As shown in FIG. 6, the joining method includes: first placing the circular plate 52 on a worktable such that the wafer placement surface 52a of the circular plate 52 faces down; applying the flux P in a ring pattern to a surface of the circular plate 52 that is opposite to the wafer placement surface 52a; placing the intermediate ring 51 thereon; applying the flux P to the upper surface of the intermediate ring 51; and placing the cylindrical shaft 53 thereon such that the flange 53a faces downward. In this state, a load (e.g., 10 to 40 kg/$cm^2$) is applied from above to the flange 53a, and the members are treated at a prescribed joining temperature (e.g., 1600 to 1700° C.). In FIG. 5, the circular plate 52 corresponds to the second AlN member 12 or 32 described above, and the cylindrical shaft 53 corresponds to the third AlN member 13 or 33 described above. The intermediate ring 51 corresponds to the first AlN member 11 or 31 described above. Instead of or in addition to the thermocouple groove 52c, a groove for gas purging that is used when a film is deposited on a wafer may be provided in the circular plate 52.

Figure 7:
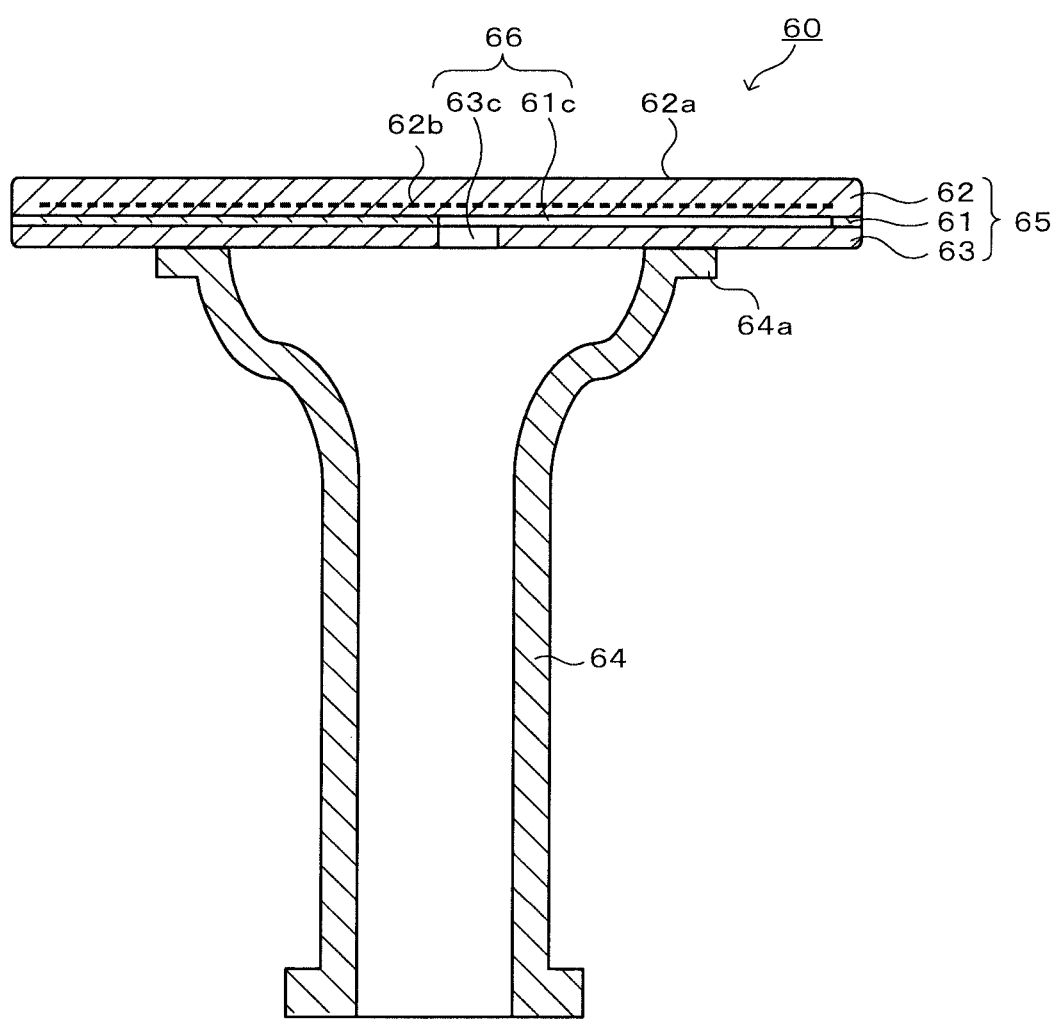
FIG. 7 is a vertical cross-sectional view of a ceramic heater 60.

A ceramic heater 60 shown in FIG. 7 includes: a second circular plate 62 having a wafer placement surface 62a and including a resistance heating element (heater) 62b embedded therein; a third circular plate 63 joined to a cylindrical shaft 64; and a first circular plate 61 sandwiched between the second circular plate 62 and the third circular plate 63. The first to third circular plates 61 to 63 are joined together using a flux to form a layered plate 65. The flux used may be, for example, a material containing calcia, alumina, and yttria. The layered plate 65 has a thermocouple groove 66 that is provided thereinside so as to extend in the radial direction. The thermocouple groove 66 is composed of a linear groove 61c formed in the first circular plate 61 and a through hole 63c passing vertically through the third circular plate 63. The cylindrical shaft 64 has a flange 64a on the side facing the third circular plate 63, and the flange 64a is joined to the third circular plate 63. The joining can be performed according to FIG. 6. In FIG. 7, the second circular plate 62 corresponds to the second AlN member 12 or 32 described above, and the third circular plate 63 corresponds to the third AlN member 13 or 33 described above. The first circular plate 61 corresponds to the first AlN member 11 or 31 described above. Instead of or in addition to the thermocouple groove 66, a groove for gas purging that is used when a film is deposited on a wafer may be provided in the layered plate 65.

In the AlN joined bodies 10 to 40 and the ceramic heaters 50 and 60 in the embodiments described above in detail, the members can be joined together under a small load. Therefore, the members are well joined together, and cracks are unlikely to occur in the members. Moreover, the exuding amount of the flux used for joining is small, and the amount of particles generated during use is also small. In addition, deformation of each member is small.

The present invention is not at all limited to the embodiments described above, and it will be appreciated that the present invention can be implemented in various forms so long as they fall within the technical scope of the invention.

For example, in the embodiments described above, the first to third AlN members 11 to 13 exemplified are disk members having the same size, but this is not a limitation. For example, the first to third AlN members 11 to 13 may have different shapes and different sizes. The same applies to the first to third AlN members 31 to 33.

In the embodiments described above, the flux (paste for joining) is used. However, instead of the flux, a sheet for joining may be used.

Thick AlN plates containing yttria and a thin AlN plate containing no yttria (its content is equal to or below the detection limit) and sandwiched therebetween may be fired to obtain a layered AlN plate with high thermal conductivity. The higher the content of yttria in an AlN plate, the higher its thermal conductivity. In the layered AlN plate obtained, the volume ratio of the plates containing yttria is high, and therefore the thermal conductivity of the layered AlN plate is good.

By joining plates together, a thermocouple groove, a gas groove, etc. are provided in the plates. In this case, since firing can be performed under a lower pressure, deformation can be prevented, and the plate produced can have good thermal conductivity.

By alternately stacking aluminum nitride containing yttria and aluminum nitride whose yttria content is equal to or below the detection limit, three of more layers can be stacked.

EXAMPLES

Examples of the present invention will next be described. However, the following Examples do not limit the invention in any manner.

Example 1

1. Production of Circular Plate

An $Y_2O_3$ powder was added to an AlN raw material powder, and these were mixed in a ball mill to obtain a powder mixture. Then the powder mixture was granulated by spray drying. The $Y_2O_3$ powder was added in an amount of 5% by mass with respect to the total mass. Next, the obtained granules were used to produce a disk-shaped compact. The compact was subjected to hot-press firing to produce an AlN sintered body used as a circular plate. In the hot-press firing, the maximum temperature during the firing (the firing temperature) was set to 1650 to 1850° C., and the holding time at the firing temperature was set to 2 hours. The pressing pressure was set to 20 MPa, and the atmosphere was set to a nitrogen atmosphere.

2. Production of Cylindrical Shaft

An $Y_2O_3$ powder was added to an AlN raw material powder, and they were mixed in a ball mill to obtain a powder mixture. Then the powder mixture was granulated by spray drying. The $Y_2O_3$ powder was added such that its content in a sintered body was 5% by mass. Next, the obtained granules were used to produce a compact. Then the compact was fired at normal pressure to produce an AlN sintered body (cylindrical shaft). The maximum temperature during firing (the firing temperature) was set to 1750 to 1900° C., and the holding time at the firing temperature was set to 1 to 5 hours. The atmosphere was set to a nitrogen atmosphere.

3. Production of Intermediate Ring

A MgO powder and a $TiO_2$ powder were added to an AlN raw material powder, and they were mixed in a ball mill to obtain a powder mixture. Then the powder mixture was granulated by spray drying. The MgO powder was added such that its content in a sintered body was 1% by mass, and the $TiO_2$ powder was added such that its content in the sintered body was 0.5% by mass. Next, the obtained granules were used to produce a compact. Then the compact was subjected to hot-press firing to produce an AlN sintered body. In the hot-press firing, the maximum temperature during firing (the firing temperature) was set to 1750 to 1850° C., and the holding time at the firing temperature was set to 1 to 5 hours. The pressing pressure was set to 20 MPa, and the atmosphere was set to a nitrogen atmosphere. After the firing, a central portion of the plate was hollowed by machining to produce an intermediate ring having a thickness of 3 mm. The intermediate ring may be fired after shaping into a ring shape.

4. Production of Joined Body

A flux (paste for joining) was prepared as follows. The paste was produced through (a) the step of mixing CaO, $Al_2O_3$, $Y_2O_3$ at a mass ratio 35 to 40:42 to 47:17 to 22 such that the total was 100 to thereby obtain a powder mixture and subjecting the powder mixture to heat treatment at 1330 to 1390° C. to thereby obtain a synthesized powder, (b) the step of mixing the synthesized powder and an AlN powder at a mass ratio of 100:60 to 70 and pulverizing the mixture to an average particle diameter of 30 μm to obtain a pulverized powder, and (c) the step of kneading the pulverized powder using ethanol as a solvent. The circular plate, the cylindrical shaft, the intermediate ring, and the flux were used to produce a joined body (a shaft-attached plate) as follows. As shown in FIG. 6, the circular plate, the paste, the intermediate ring, the paste, and the cylindrical shaft were stacked from below. Joining was performed at a maximum temperature of 1600 to 1700° C. using a load of 10 to 40 $kg/cm^2$ in a nitrogen atmosphere. Instead of the flux, joining sheets may be used.

5. Evaluation

An ultrasonic flaw detector was used to inspect the presence or absence of defects on the joint surfaces of the obtained joined body, and no defects were found on the joint surfaces. SEM photographs of the joint surfaces were observed. No defects were found on the joint surfaces, and the joinability was found to be good. The appearance of the joined body was observed. Then the circular plate and the cylindrical shaft were found to be white, and the intermediate ring was found to be gray (this may be due to the influence of $TiO_2$) In the intermediate ring, diffusion layers into which the flux component had been diffused were found in the vicinity of the joint surface between the intermediate ring and the circular plate and in the vicinity of the joint surface between the intermediate ring and the cylindrical shaft. The content of $Y_2O_3$ in a portion other than the diffusion layers was measured using a high-frequency inductive coupling plasma emission spectrometer (ICP-AES9) and found to be equal to or below the detection limit (5 mass ppm or lower). In the circular plate, a diffusion layer was found in the vicinity of the joint surface between the circular plate and the intermediate ring. The content of $Y_2O_3$ in a portion other than the diffusion layer was similarly measured and found to be 5% by mass. In the cylindrical shaft, a diffusion layer was found in the vicinity of the joint surface between the cylindrical shaft and the intermediate ring. The content of $Y_2O_3$ in a portion other than the diffusion layer was similarly measured and found to be 5% by mass. The joint strength was measured using a four-point bending method according to JIS 1601 and found to be 370 MPa.

Comparative Example 1

A joined body was produced using the same circular plate and the same cylindrical shaft as those in Example 1 as follows. Specifically, the same flux as that in Example 1 was applied between the circular plate and the cylindrical shaft to join them together. The joining was performed at a maximum temperature of 1630° C. using a load of 80 $kg/cm^2$ in a nitrogen atmosphere. The obtained joined body was visually inspected, and a crack was found in the circular plate.

Comparative Example 2

A joined body was produced using the same circular plate and the same cylindrical shaft as those in Example 1 as follows. Specifically, the same flux as that in Example 1 was applied between the circular plate and the cylindrical shaft to join them together. The joining was performed at a maximum temperature of 1630° C. using a load of 40 $kg/cm^2$ in a nitrogen atmosphere. The joint strength of the obtained joined body was low. The joined body was observed under an SEM, and aggregation of the flux at the joint interface was found.

In Example 1 above, the circular plate containing 5% by mass of yttria and the cylindrical shaft containing 5% by mass of yttria were joined with the intermediate ring with a low yttria concentration interposed therebetween. However, the circular plate containing 5% by mass of yttria and a cylindrical shaft having a low yttria concentration may be joined together with no intermediate ring interposed therebetween.

Moreover, a circular plate containing several % by mass of yttria and a cylindrical shaft containing yttria at a lower concentration than that in the circular plate may be joined together with an intermediate ring with a lower yttria concentration than those in the circular plate and the cylindrical shaft interposed therebetween. In this case, when the content of yttria in the intermediate ring is equal to or below the detection limit, a joined body having higher strength can be obtained.

The present application claims priority from Japanese Patent Application No. 2021-135883, filed on Aug. 23, 2021, the entire contents of which are incorporated herein by reference.

What is claimed is:

1. An AlN joined body comprising
a first AlN member and a second AlN member that are joined together,
wherein a content of yttria in the first AlN member is equal to or below 5 mass ppm,
wherein the first AlN member contains magnesia and titania as oxides,
wherein a total amount of the oxides added in the first AlN member is 0.1 to 3% by mass, and
wherein the second AlN member contains yttria.

2. The AlN joined body according to claim 1, wherein the content of yttria in the second AlN member is 0.07% by mass or more.

3. The AlN joined body according to claim 1, wherein the first AlN member contains at least one oxide selected from the group consisting of rare earth metal oxides other than yttria, magnesia, and titania.

4. The AlN joined body according to claim 1, further comprising
a third AlN member joined to a surface of the first AlN member, the surface being opposite to a joint surface of the first AlN member that is joined to the second AlN member,
wherein the third AlN member contains yttria.

5. The AlN joined body according to claim 4, wherein the content of yttria in the third AlN member is 0.07% by mass or more.

6. An AlN joined body comprising
a first AlN member and a second AlN member that are joined together,
wherein the first AlN member has a first diffusion layer formed as a result of the joining,
wherein the second AlN member has a second diffusion layer formed as a result of the joining,
wherein the first AlN member contains magnesia and titania as oxides,
wherein a total amount of the oxides added in the first AlN member is 0.1 to 3% by mass,
wherein a content of yttria in a portion of the first AlN member other than the first diffusion layer is equal to or below 5 mass ppm, and
wherein a portion of the second AlN member other than the second diffusion layer contains yttria.

7. The AlN joined body according to claim 6, wherein the content of yttria in the portion of the second AlN member other than the second diffusion layer is 0.07% by mass or more.

8. The AlN joined body according to claim 6, wherein the first AlN member contains at least one oxide selected from the group consisting of rare earth metal oxides other than yttria, magnesia, and titania.

9. The AlN joined body according to claim 6, further comprising
a third AlN member joined to a surface of the first AlN member and having a third diffusion layer formed as a result of the joining, the surface being opposite to a joint surface of the first AlN member that is joined to the second AlN member,
wherein the first AlN member has another first diffusion layer formed as a result of the joining to the third AlN member,
wherein the content of yttria in a portion of the first AlN member other than the two first diffusion layers is equal to or below the detection limit, and
wherein a portion of the third AlN member other than the third diffusion layer contains yttria.

10. The AlN joined body according to claim 9, wherein the content of yttria in the portion of the third AlN member other than the third diffusion layer is 0.07% by mass or more.

11. The AlN joined body according to claim 4, wherein the second AlN member is a circular plate having a wafer placement surface,
wherein the third AlN member is a cylindrical shaft having a diameter smaller than the diameter of the circular plate, and
wherein the first AlN member is a ring sandwiched between the circular plate and the cylindrical shaft.

12. The AlN joined body according to claim 9, wherein the second AlN member is a circular plate having a wafer placement surface,
wherein the third AlN member is a cylindrical shaft having a diameter smaller than the diameter of the circular plate, and
wherein the first AlN member is a ring sandwiched between the circular plate and the cylindrical shaft.

13. The AlN joined body according to claim 4, wherein the second AlN member is a second circular plate having a wafer placement surface and including a heater embedded therein,
wherein the third AlN member is a third circular plate jointed to a cylindrical shaft, and
wherein the first AlN member is a first circular plate sandwiched between the second circular plate and the third circular plate.

14. The AlN joined body according to claim 9, wherein the second AlN member is a second circular plate having a wafer placement surface and including a heater embedded therein,
wherein the third AlN member is a third circular plate jointed to a cylindrical shaft, and
wherein the first AlN member is a first circular plate sandwiched between the second circular plate and the third circular plate.

15. The AlN joined body according to claim 11, wherein the circular plate has a groove.

16. The AlN joined body according to claim 12, wherein the circular plate has a groove.

17. The AlN joined body according to claim 13, wherein a layered plate including the first to third circular plates stacked together has a groove.

18. The AlN joined body according to claim 14, wherein a layered plate including the first to third circular plates stacked together has a groove.

* * * * *